United States Patent
Kuo et al.

(10) Patent No.: US 9,366,390 B2
(45) Date of Patent: Jun. 14, 2016

(54) LIGHT EMITTING DIODE DEVICE AND LIGHT EMITTING DIODE LAMP

(71) Applicant: Lextar Electronics Corporation, Hsinchu (TW)

(72) Inventors: Jia-Jhang Kuo, Kaohsiung (TW); Su-Hon Lin, Keelung (TW); Yun-Yi Tien, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 219 days.

(21) Appl. No.: 14/288,396

(22) Filed: May 28, 2014

(65) Prior Publication Data

US 2015/0117012 A1    Apr. 30, 2015

(30) Foreign Application Priority Data

Oct. 25, 2013 (TW) ................ 102138695 A

(51) Int. Cl.
| | | |
|---|---|---|
| *F21K 99/00* | (2010.01) | |
| *H01L 33/60* | (2010.01) | |
| *F21Y 101/02* | (2006.01) | |
| *F21V 3/00* | (2015.01) | |
| *H01L 25/075* | (2006.01) | |
| *H05K 1/02* | (2006.01) | |

(52) U.S. Cl.
CPC . *F21K 9/135* (2013.01); *F21V 3/00* (2013.01); *F21Y 2101/02* (2013.01); *H01L 25/0753* (2013.01); *H01L 33/60* (2013.01); *H01L 2224/16225* (2013.01); *H01L 2224/48091* (2013.01); *H01L 2224/48137* (2013.01); *H01L 2924/0002* (2013.01); *H05K 1/0274* (2013.01); *H05K 2201/0108* (2013.01); *H05K 2201/10106* (2013.01); *H05K 2201/2054* (2013.01); *H05K 2203/049* (2013.01)

(58) Field of Classification Search
CPC ....... F21K 9/135; F21V 3/00; F21Y 2101/02; H05K 1/0274; H05K 2201/0108; H05K 2201/2054; H05K 2201/10106; H05K 2203/049; H01L 25/0753; H01L 33/60; H01L 2224/16225; H01L 2224/48091; H01L 2224/48137; H01L 2924/0002
See application file for complete search history.

(56) References Cited

U.S. PATENT DOCUMENTS

| | | | |
|---|---|---|---|
| 5,575,459 A | 11/1996 | Anderson | |
| 9,166,125 B2 * | 10/2015 | Lin | ............ H01L 33/507 |

FOREIGN PATENT DOCUMENTS

| | | |
|---|---|---|
| CN | 102664229 A | 9/2012 |
| CN | 103000788 A | 3/2013 |
| TW | M327089 U | 2/2008 |
| TW | 201025671 A | 7/2010 |
| TW | M462819 U | 10/2013 |

* cited by examiner

*Primary Examiner* — Stephen F Husar
(74) *Attorney, Agent, or Firm* — CKC & Partners Co., Ltd.

(57) ABSTRACT

A light emitting diode (LED) device includes a transparent substrate, a first reflection layer, a LED chip, a positive electrode, a negative electrode and a wavelength-converting layer. The LED chip is disposed on a surface of the transparent substrate, and the first reflection layer is disposed between the LED chip and the transparent substrate. The positive electrode and the negative electrode are disposed on an end portion of the transparent substrate and are electrically connected with the LED chip. The wavelength-converting layer covers the first reflection layer and the LED chip.

16 Claims, 10 Drawing Sheets

LIGHT EMITTING DIODE DEVICE AND LIGHT EMITTING DIODE LAMP

RELATED APPLICATIONS

This application claims priority to Taiwan Application Ser. No. 102138695, filed Oct. 25, 2013, which is herein incorporated by reference.

BACKGROUND

1. Field of Invention

The present invention relates to a light emitting device, and more particularly to a light emitting diode (LED) and a LED lamp.

2. Description of Related Art

Light emitting diode (LED) light bulb has gradually replaced the conventional incandescent light bulb and been broadly used for its economic power consumption feature. Nevertheless, light emitting elements of a conventional LED light bulb are basically arranged toward a front position such that all the light beams tend to be projected at a single concentrated direction from the front position. Although the conventional LED light bulb may therefore has good concentrated illumination ability at the front, the luminance on the circumference of the LED light bulb has poor uniformity, which adversely affects the overall illumination performance.

For increasing the luminance on the circumference of the LED light bulb, a LED light bar which has a large emission angle is developed and can be inserted into a slot of a LED heat sink. That is, the LED light bar is erected on the heat sink of the LED light bulb, so as to increase the luminance around the LED light bulb. In such LED light bar, however, all faces like front, back and lateral surfaces of the LED light bar need to be coated with a fluorescent/phosphorescent resin layer for emitting the white light, which has an issue of high manufacturing cost.

SUMMARY

Accordingly, one aspect of the present invention is to provide a light emitting diode (LED) device and a LED lamp to resolve the aforementioned problem of the related art.

According to an embodiment of the invention, a LED device is provided. The LED device includes a transparent substrate, a first and a second reflection layers, a first and a second LED chips, a positive electrode, a negative electrode and a wavelength-converting layer. The substrate includes a first surface and a second surface opposite to the first surface, in which the first surface includes a first reflection zone, a second reflection zone and a transparent zone outside of the first reflection zone and the second reflection zone thereon. A first and a second reflection layers are disposed on the first and the second reflection zones respectively. A first and a second LED chips are electrically connected with each other and are disposed on the first and the second reflection layers respectively, in which an orthographic projection of the first LED chip onto the transparent substrate is located within the first reflection zone and an orthographic projection of the second LED chip onto the transparent substrate is located within the second reflection zone. A positive electrode and a negative electrode are disposed on an end of the transparent substrate and electrically connected to the first and the second LED chips respectively. A wavelength-converting layer at least covers the first, the second reflection layers and the first, the second LED chips, in which the first and the second reflection layers respectively reflect a portion of light beams emitted from the first and the second LED chips to the wavelength-converting layer.

According to another embodiment of the invention, a LED device is provided. The LED device includes a transparent substrate, N first reflection layers, N second reflection layers, N first LED chips, N second LED chips, a positive electrode, a negative electrode and a wavelength-converting layer. The transparent substrate includes a first surface and a second surface opposite to the first surface, in which the first surface includes a first row formed by arranging N first reflection zones in sequence and a second row formed by arranging N second reflection zones in sequence and a transparent zone outside of the first row and the second row thereon. The N first reflection layers are disposed on the N first reflection zones respectively and N second reflection layers are disposed on the N second reflection zones respectively. The N first LED chips are electrically connected with each other and disposed on the N first reflection layers respectively, and an orthographic projection of each of the N first LED chips onto the transparent substrate is within the relative first reflection zone. The N second LED chips are electrically connected with each other and disposed on the N second reflection layers respectively, and an orthographic projection of each of the N second LED chips onto the transparent substrate is within the relative second reflection zone. The positive electrode and the negative electrode are disposed on an end of the transparent substrate, in which the positive electrode is electrically connected to the first one of the N first LED chips arranged in the first row, the negative electrode is electrically connected to the first one of the N second LED chips arranged in the second row, and the $i^{th}$ first LED chip of the first row is electrically connected to the second LED chip of second row. The wavelength-converting layer at least covers the N first reflection layers, the N second reflection layers, the N first LED chips and the N second LED chips. The N first and the N second reflection layers respectively reflect a portion of light beams emitted from the N first and the N second LED chips to the wavelength-converting layer, N and i are a natural number and N>1.

According to yet another embodiment of the invention, a LED device is provided. The LED device includes a transparent substrate, N first and N second reflection layers, N LED chips, a positive electrode and a negative electrode, and a wavelength-converting layer. The transparent substrate includes a first surface and a second surface opposite to the first surface, in which the first surface includes a first row formed by arranging N first reflection zones in sequence and a second row formed by arranging N second reflection zones in sequence and a transparent zone outside of the first row and the second row thereon. N first reflection layers are disposed on the N first reflection zones respectively and N second reflection layers disposed on the N second reflection zones respectively, in which the $i^{th}$ first reflection layer and the $i^{th}$ second reflection layer are aligned with each other and electrically connected with each other. The $i^{th}$ LED chip bridges the $i^{th}$ first reflection layer and the $i^{th}$ second reflection layer by means of flip-chip bonding. The positive electrode and the negative electrode are disposed on an end of the transparent substrate, in which the positive electrode is electrically connected to the first one of the N first LED chips arranged in the first row, and the negative electrode is electrically connected to the first one of the N second LED chips arranged in the second row. The wavelength-converting layer at least covers the N first reflection layers, the N second reflection layers and the N LED chips, in which the N first and the N second reflection layers respectively reflect a portion of light beams emitted from the N LED chips to the wavelength-converting layer. N and i are a natural number and N>1, 1≤i≤N.

According to yet another embodiment of the invention, a LED lamp is provided. The LED lamp includes a lamp base and a LED device mentioned above. The lamp base includes a power driving member. An end of the transparent substrate of the LED device is inserted into the lamp base and electrically connected to the power driving member.

According one or more embodiments of the invention, the first reflection layers and the second reflection layers are separated from each other.

According one or more embodiments of the invention, the material of the first reflection layer and the second reflection layer includes metal.

According one or more embodiments of the invention, the first and the second LED chips are respectively a first and a second high-voltage LED chips.

According one or more embodiments of the invention, a light beam emitted from a side face of the first LED chip and an edge of the relative first reflection layer intersects at an angle between 17-50 degrees. A light beam emitted from a side face of the second LED chip and an edge of the relative second reflection layer intersects at an angle between 17-50 degrees.

According one or more embodiments of the invention, the lamp base has a slot including a positive contact point and a negative contact point. The end of the transparent substrate includes the positive electrode and the negative electrode which are inserted into the slot such that the positive contact point and the negative contact point are electrically connected to the positive electrode and the negative electrode respectively.

According one or more embodiments of the invention, the LED lamp further includes a lamp cover jointing to the lamp base and the LED device is covered between the lamp cover and the lamp base.

As discussed above, the LED device and the LED lamp can make all the ht beams emitted from the LED chips reach to the wavelength-converting layer by the configuration of the first reflection layer and the second reflection layer, in which some light beams may be reflected by the first or the second reflection layers to the wavelength-converting layer, and the other light beams may directly emit to the wavelength-converting layer, so as to prevent the issue of blue-ray leakage from the second surface or other surfaces of the transparent substrate. Furthermore, the wavelength-converting layer can convert the light beams emitted from the LED chips into different wavelength, and then mixing into a predetermined colored light, in which the predetermined colored light can pass through the transparent zone of the transparent substrate, so as to achieve the effect of emitting the light on double-sided.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
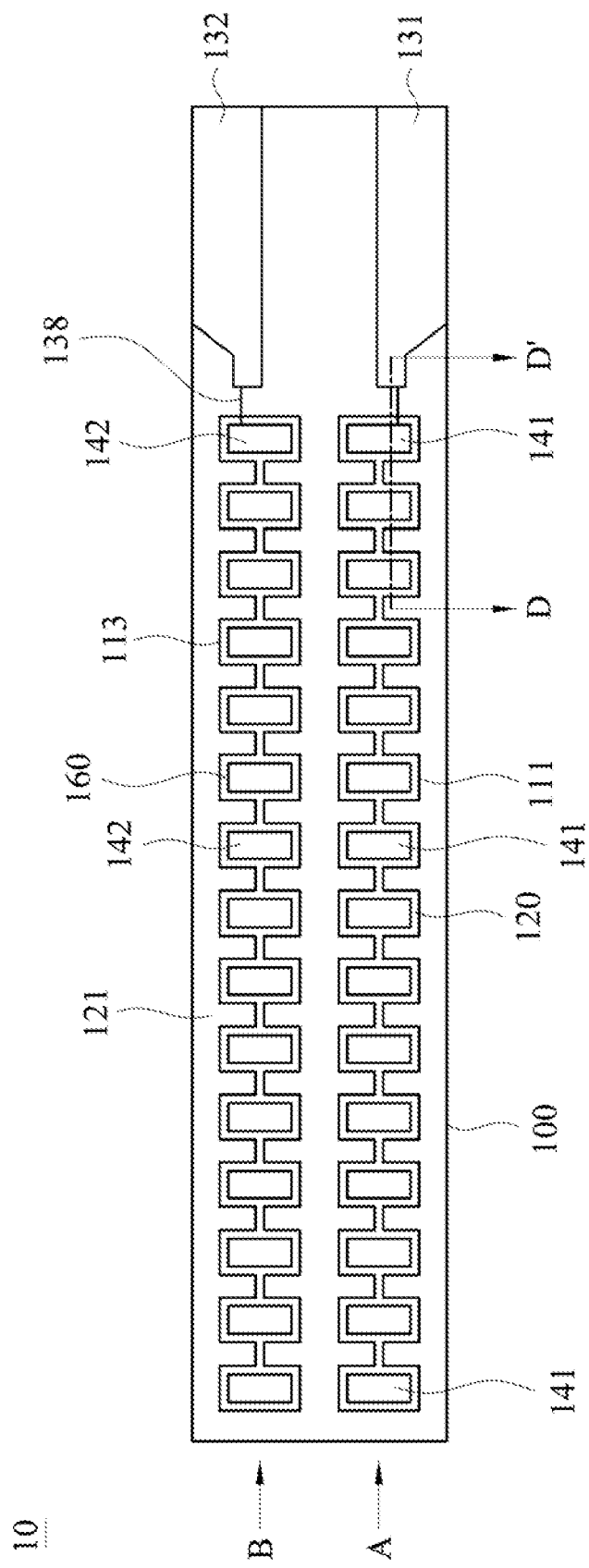
FIG. 1A illustrates a LED device in accordance with a first embodiment of the invention.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations. Wherever possible, the same reference numbers are used in the drawings and the description to refer to the same or like parts.

A light emitting diode (LED) device and a LED lamp using the same is provided in following embodiments, in which a wavelength-converting layer of the LED device is disposed only on one single side having LED chips, and does not need to be disposed on double sides of the LED device to prevent the leakage of blue-ray but also capable of converting all light beams emitted from LED chips into white light. In other words, the LED device of the following embodiments emit the white light from all faces and only has one side coated with the wavelength-converting layer.

Figure 1B:
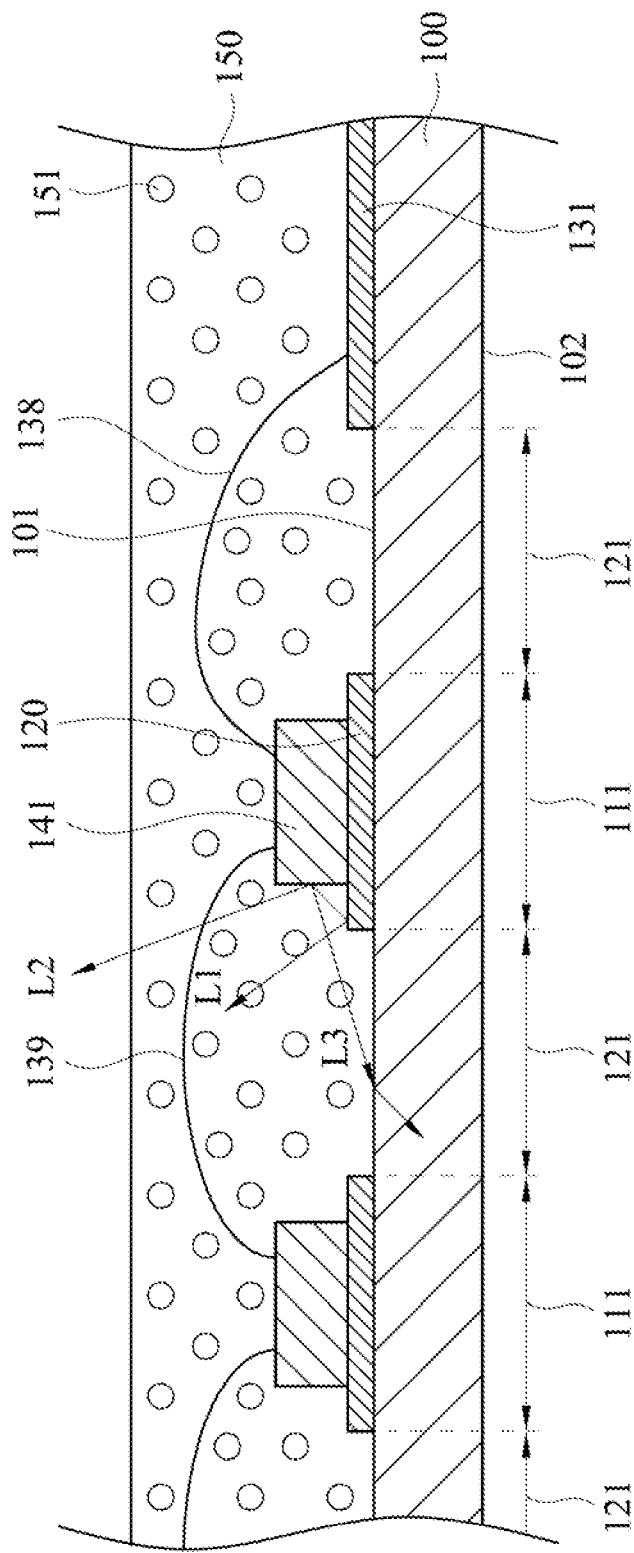
FIG. 1B illustrates a cross-sectional view taken along D-D' of FIG. 1A.

Please refer to FIG. 1A and FIG. 1B, in which FIG. 1A illustrates a LED device in accordance with a first embodiment of the invention, and FIG. 1B illustrates a cross-sectional view taken along D-D' of FIG. 1A. As illustrated, the LED device 10 includes a transparent substrate 100, N first reflection layers 120, N second reflection layers 160, N first LED chips 141, N second LED chips 142, a positive electrode 131, a negative electrode 132 and a wavelength-converting layer 150, in which N is a natural number larger than 1.

The transparent substrate 100 includes a first surface 101 and a second surface 102 opposite to the first surface 101, in which the first surface 101 includes N first reflection zones 111, N second reflection zones 113 and a transparent zone 121. Further, a first row A is formed by arranging the N first reflection zones 111 in sequence, a second row B is formed by arranging the N second reflection zone 113 in sequence and the transparent zone 121 is outside of the first row A and the second row B.

In present embodiment, each of the first reflection zones 111 can have rectangular shape, and two adjacent rectangular zones 111 are connected with each other. Similarly, each of the second reflection zones 113 can have a rectangular shape, and two adjacent rectangular zones 113 are connected with each other. In other embodiments, these first reflection zones 111 may be separated from each other, and these second reflection zones 113 may be separated from each other. Further, in present embodiment, the first reflection zones 111 dose not physically connected with any one of the second reflection zones 113.

In one embodiment, the material of the transparent substrate 100 may pervious to light and be made of glass, ceramics, plastics, resin or silica gel. Further, the transparent substrate 100 may include a photo-permeable patterned conductive line (not illustrated) located on the first surface 101.

The N first reflection layers 120 are disposed on the N first reflection zones 111 respectively and one by one. The N second reflection layers 160 are disposed on the N second reflection zones 113 respectively and one by one. Further, the N first reflection zones 111 do not contact with the N second reflection zones 113, so the N first reflection layers 120 are electrically insulated from the N second reflection layers 160. In the present embodiment, the material of the N first reflection layers 120 and the N second reflection layers 160 may include metal with high reflectivity and conductivity, but is not limited thereto. In other embodiments, the N first reflection layers 120 and the N second reflection layers 160 can be the material with high-reflectivity but have no conductivity.

The N first LED chips 141 are disposed on the N first reflection layers 120 respectively and those N first LED chips 141 are electrically connected with each other. An orthographic projection of the each of the N first LED chips 141 onto the transparent substrate 100 is located within the relative first reflection zone 111 and smaller than the first reflection zone 111.

Similarly, the N second LED chips 142 are disposed on the N second reflection layers 160 respectively and those N second LED chips 142 are electrically connected with each other. An orthographic projection of the each of the N second LED chips 142 onto the transparent substrate 100 is within the relative second reflection zone 113 and smaller than the second reflection zone 113.

Figure 1C:
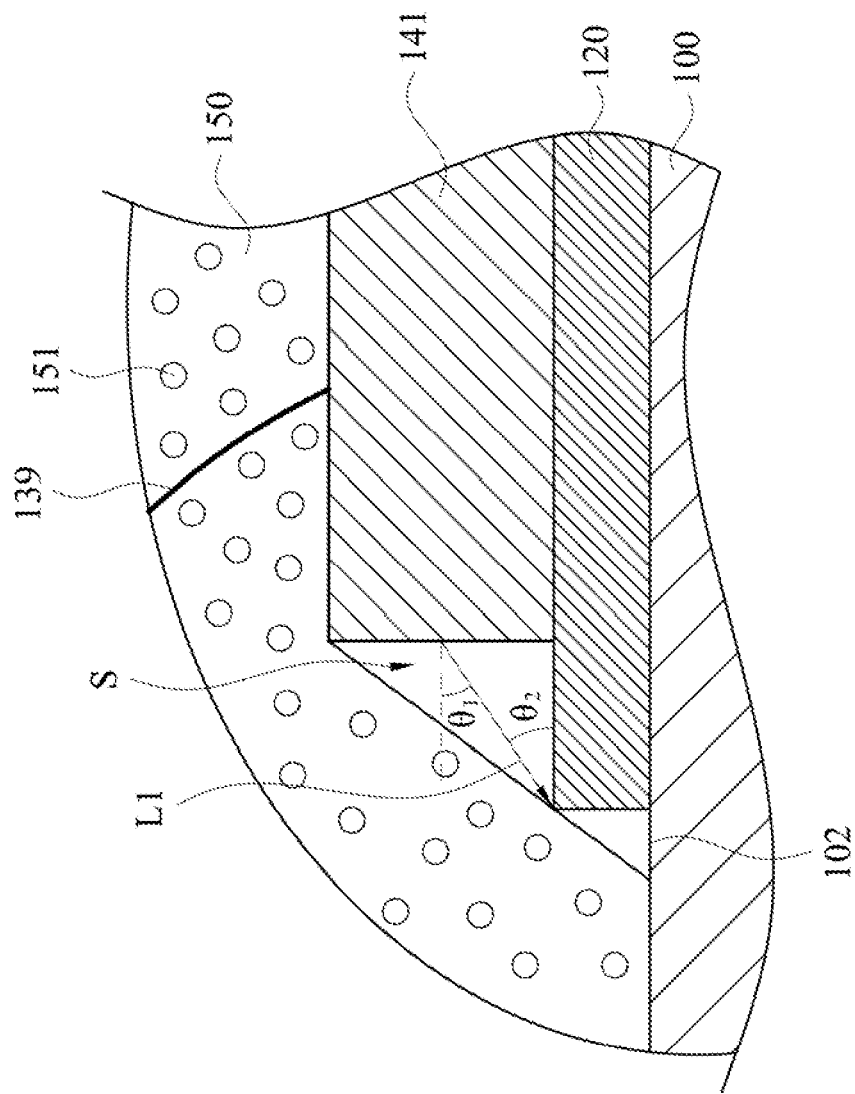
FIG. 1C illustrates a partial enlarged view of one LED chip in FIG. 1B.

Please Refer to FIG. 1C, which illustrates a partial enlarged view of one LED chip in FIG. 1B. As illustrated, each of the first LED chips 141 can be directly disposed on the first reflection layer 120 via gluing. Similarly, each of the second LED chips 142 (illustrated in FIG. 1A) can be also directly disposed on the second reflection layer 160 via gluing, but is not limited thereto.

After the first and the second LED chips 141, 142 are disposed on the first and the second reflection layers 120, 160 respectively, the wavelength-converting layer 150 needs to at least cover on the first reflection layers 160, the second reflection layers 120, the first LED chips 141, and the second LED chips 142. The wavelength-converting layer 150 is used to convert a wavelength of light beams emitted from the first and the second LED chips 141, 142.

For example, if the first and the second LED chips 141, 142 are a blue light chip, the wavelength-converting layer 150 may include yellow phosphors 151. As a result, partial of blue light emitted from the first and the second LED chips 141 can be converted into yellow light. Next, the converted yellow light can be mixed with the remaining blue light, so as to produce the white light.

With reference to FIG. 1C, while manufacturing the LED device 10, because of vertical-height of the first LED chips 141 itself, the wavelength-converting layer 150 may not be able to nearly 100% cover or fill a space within a side face of the first LED chips 141 and the transparent substrate 100. That is, in FIG. 1C, there is a gap S between a side face of the first LED chips 141 and the transparent substrate 100. As a result, an area or size of the first reflection layer 120 need to be slightly greater than an area or size of the first LED chip 141 so as to avoid the light beams emitted from the first LED chips 141 reaching the second surface 102 of the transparent substrate 100 without passing through the wavelength-converting layer 150. Similarly, the gap S also exists between a side face of the second LED chips 142 and transparent substrate 100 even though not shown in FIG. 1C.

In other words, the area of the first reflection layer 120 and the second refection layer 160 is slightly greater than the area the first LED chip 141 and the second LED chip 142 respectively such that the light beams emitted into the gap S could be reflected back to the wavelength-converting layer 150 by the first and the second reflection layers 120, 160.

More specifically for a relation between the first reflection layers 120 and the first LED chips 141, a light beam L1 emitted from a central position of the side face of the first LED chip 141 is shown in FIG. 1C, and the light beam L1 has not been converted by the wavelength-converting layer 150 yet. An angle between the light beam L1 and a horizontal direction is $\theta_1$, and an angle between the light beam L1 and an edge of the first reflection layer 120 is $\theta_2$. The angle $\theta_1$ and $\theta_2$ are about 38 degrees in present embodiment, but is not limited thereto. In other embodiments, the angle $\theta_1$ and $\theta_2$ are about 17~50 degrees. Similarly, a relation between the second reflection layers 160 and the second LED chips 142 is substantially the same with the first reflection layers 120 and the first LED chips 141. In other words, the light beam L1 emitted from a central position of the side face of each of the N first or the N second LED chips 141, 142 and the edge of the relative first or the relative second reflection layers 120, 160 may intersect at an angle $\theta_2$ between 17~50 degrees.

Next, with reference to FIG. 1B and FIG. 1C the first LED chip 141 is a kind of a surface light source. Therefore, except the light beam L1 the first LED chip 141 is capable of emitting many different paths of light beams, such as light beams L2 and L3. For example, the light beam L1 is reflected back to the wavelength-converting layer 150 by the first reflection layer 120 and thus a wavelength of the light beam L1 can be converted. The light beam L2 is emitted directly toward to the wavelength-converting layer 150 and thus directly enters into the wavelength-converting layer 150 so that a wavelength of the light beam L2 can be converted. An angle of the light beam L3 and the horizontal direction is smaller than the light beam L1 with the horizontal direction, so that the Light beam L3 is emitted directly toward to the wavelength-converting layer 150 and a wavelength of the light beam L3 can be converted.

As a result, the light emitting device 10 of the present embodiment can emit the white light on double-sided. All the light beams L1, L2, L3 that may reach the second surface 102 of the transparent substrate 100 are converted by the wavelength-converting layer 150 and are mixed into white light, such that it is no blue-ray leakage may occur from any sides or faces of the light emitting device 10. Furthermore, by the arrangement of the first reflection layers 120 and the second reflection layers 160, the wavelength-converting layer 150 only needs to be disposed on the first surface 101 of the transparent substrate 100 and does not need to be disposed on both the first surface 101 and the second surface 102. Therefore, compared to the related art, the present embodiment can decrease the cost of manufacturing the wavelength-converting layer 150.

Next, with reference to FIG. 1A and FIG. 1B, the light emitting device 10 further include a positive electrode 131, a negative electrode 132 and conducive wires 138, 139 (illustrate in FIG. 1B). The positive electrode 131 and the negative electrode 132 are disposed on an end portion of the transparent substrate 100, in which the positive electrode 131 is electrically connected to the first one of the N first electrode LED chips arranged in the first row A through the conductive wire 138, and the negative electrode 132 is electrically connected to the first one of the N second LED chips 142 arranged in the second row B through the conductive wire 138. The conductive wire 139 is electrically connected between a positive and a negative ends of the first, and the second LED chips 141, 142, so as to series connect the N first LED chips 141 arranged in the first row A and series connect the N second LED chips 142 arranged in the second row B. In the present embodiment, the material of the first electrode 131 and the second electrode 132 is the same with the material of the first and the second reflection layers 120, 160, and the first and the second electrodes 131, 132 may formed simultaneously with the first and the second reflection layers 120, 160 on the transparent substrate 100 during the same manufacturing process, and the conductive wires 138, 139 may connect each of the first and the second LED chips 141, 142 by means of wire bonding.

It is should be noted that, the first one of the N first LED chips 141 arranged in the first row A means a first LED chip 141 nearest to the positive electrode 131, and the N$^{th}$ one of the N first LED chips 141 arranged in the first row A means a first LED chip 141 furthest from the positive electrode 131. Similarly, the first one of the N second LED chips 142 arranged in the second row B means a second LED chip 142 nearest to the negative electrode 132, and the N$^{th}$ one of the N second LED chips 142 arranged in the second row B means a second LED chip 142 furthest from the negative electrode 132.

In practical use, a total number of the first and the second LED chips 141, 142 is thirty in FIG. 1A. The first and the second LED chips 141, 142 may belong to a small power light chip, the driving voltage of which is about 3V. The voltage between the positive electrode 131 and the negative electrode 132 can be 110V, so as to drive thirty first and second LED chips 141, 142 to emit the light in present embodiment.

It is worth mention that, in some embodiments, the transparent substrate 100 may have other types of the first and the second LED chips 141, 142 disposed on the first and the second reflection layers 120, 160. For example, in some embodiment, a rectangle first reflection zone and a rectangle second reflection zone 111, 113 nearest to the positive and the negative electrodes 131, 132 respectively may have an area greater than other first and second reflection zones 111, 113 disposed on other positions. Therefore, after the first and the second reflection layers 120, 160 are disposed on the first and the second reflection zones 111, 113 having greater area, a first and a second LED chips 141, 142 that is driven by high voltage power may be suitable for being disposed on the first and the second reflection layers 120, 160 having greater area, respectively.

Figure 2:
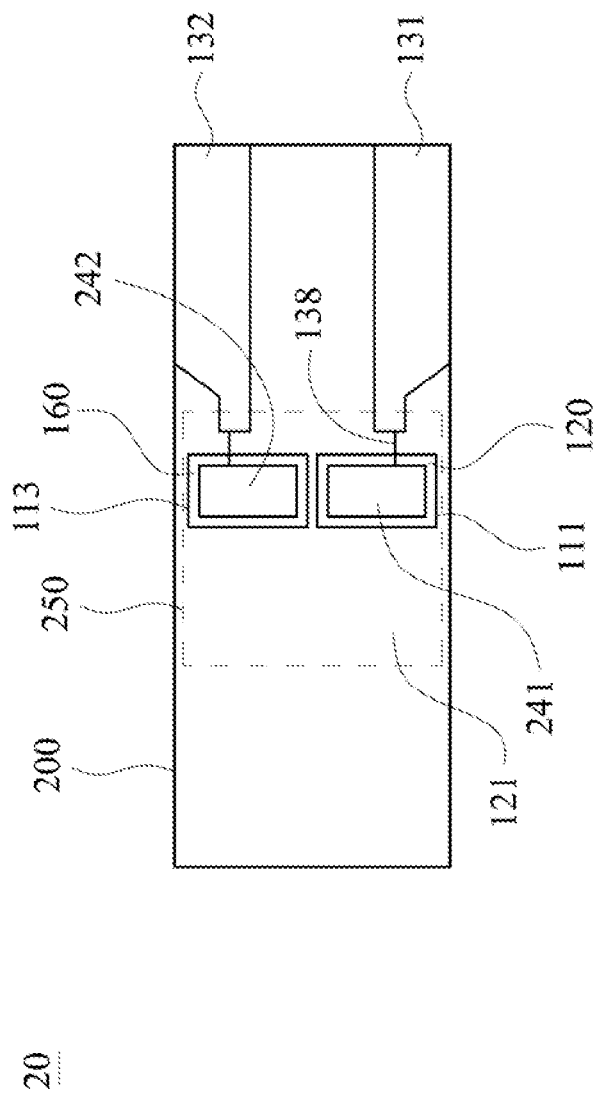
FIG. 2 illustrates a LED device in accordance with a second embodiment of the invention.

Next, please refer to FIG. 2, which illustrates a LED device 20 in accordance with a second embodiment of the invention. As illustrated in FIG. 2, the differences between the first embodiment and the present embodiment is that the LED device 20 of the present embodiment is specifically used to apply on first and second high-voltage LED chips 241, 242 (HV LED chips). The following descriptions mainly introduce a structural difference between the second embodiment and the first embodiment, and the same numeral numbers denotes the same or similar structure in the first embodiment.

As illustrate in FIG. 2, a transparent substrate 200 of the LED device 20 only has two HV LED chips 241, 242, such that the size of the transparent substrate 200 of the present embodiment can be smaller than the transparent substrate 100 of the first embodiment. More specifically, the length of the transparent substrate 200 of the present embodiment may be half-length of the transparent substrate 100 of the first embodiment.

Furthermore, in the first embodiment, there are N first reflection zones 111, N second reflection zones 113, N first reflection layers 120 and N second reflection layers. In the present embodiment, there are only a single one first reflection zone 111, a single one second reflection zone 113, a single one first reflection layer 120 and a single one second reflection zone 160. In some embodiments, the first and second HV LED chips 241, 242 have a larger size than the first and second LED chips 141, 241 driven by the small power. Therefore, the first and the second reflection zones 111, 113 and the first and the second reflection layers 120, 160 of the second embodiment may have greater area than the first and the second reflection zones 111, 113 and the first and the second reflection layers 120, 160 of the first embodiment.

In practical use, the first and the second chips 241, 242 may be driven by 46V, and the first HV LED chip 241 is series connected with the second HV LED chip 242. As a result, if a voltage potential between the positive electrode 131 and the negative electrode 132 is 110V, then first and the second HV LED chips 241, 242 can be driven by such voltage potential.

Because the size of the transparent substrate 200 of the present embodiment is smaller than the transparent substrate 100 of the first embodiment, and it only needs single one first and single one second HV LDE chips 241, 242 in present embodiment; therefore, a coating area of a wavelength-converting layer 250 of the present embodiment is also smaller than the first embodiment. More specifically, in present embodiment, the wavelength-converting layer 250 only needs to cover the first and the second reflection layers 120, 160 and the first and second HV LED chips 241, 242, and does not need to cover the whole surface of the transparent substrate 200.

As a result, compared with the first embodiment, the present embodiment can further decrease the manufacturing cost of the transparent substrate 200, the wavelength-converting layer 250, and the first and the second reflection layer 120, 160. Further, because of the configuration of the first and the second reflection layers 120, 160, the LED device 20 of the present embodiment can also prevent the occurrence of blue-ray leakage.

Figure 3A:
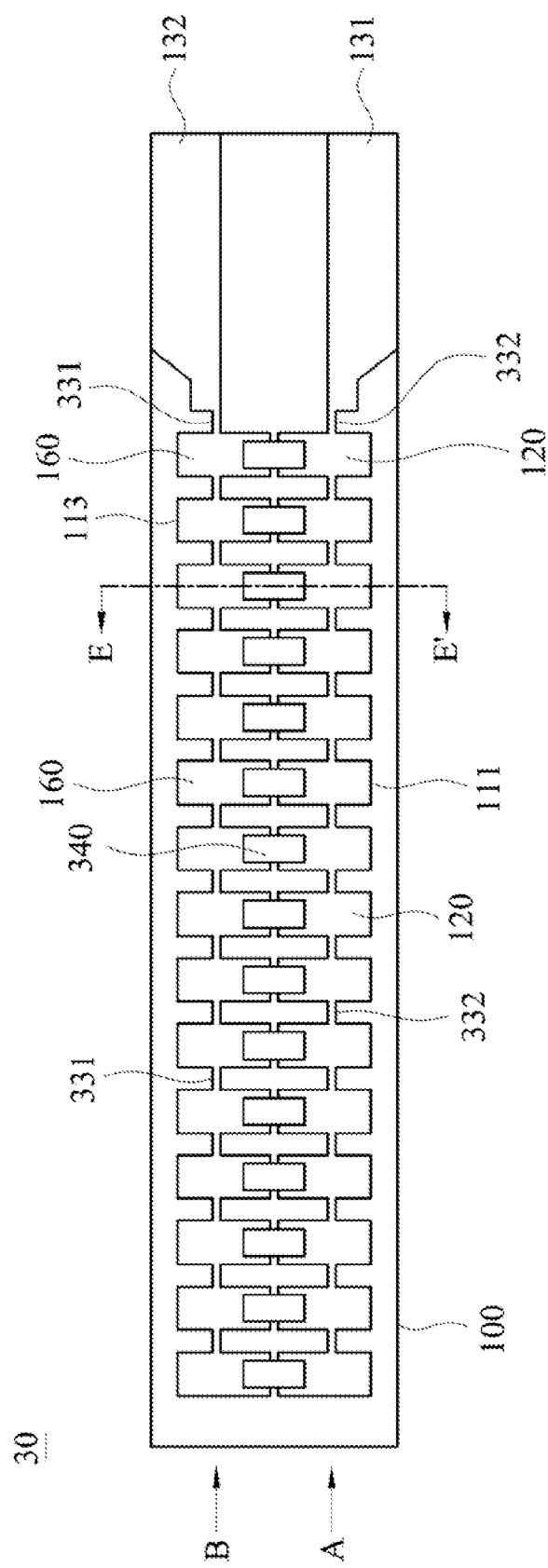
FIG. 3A illustrates a LED device in accordance with the third embodiment of the invention.
Figure 3B:
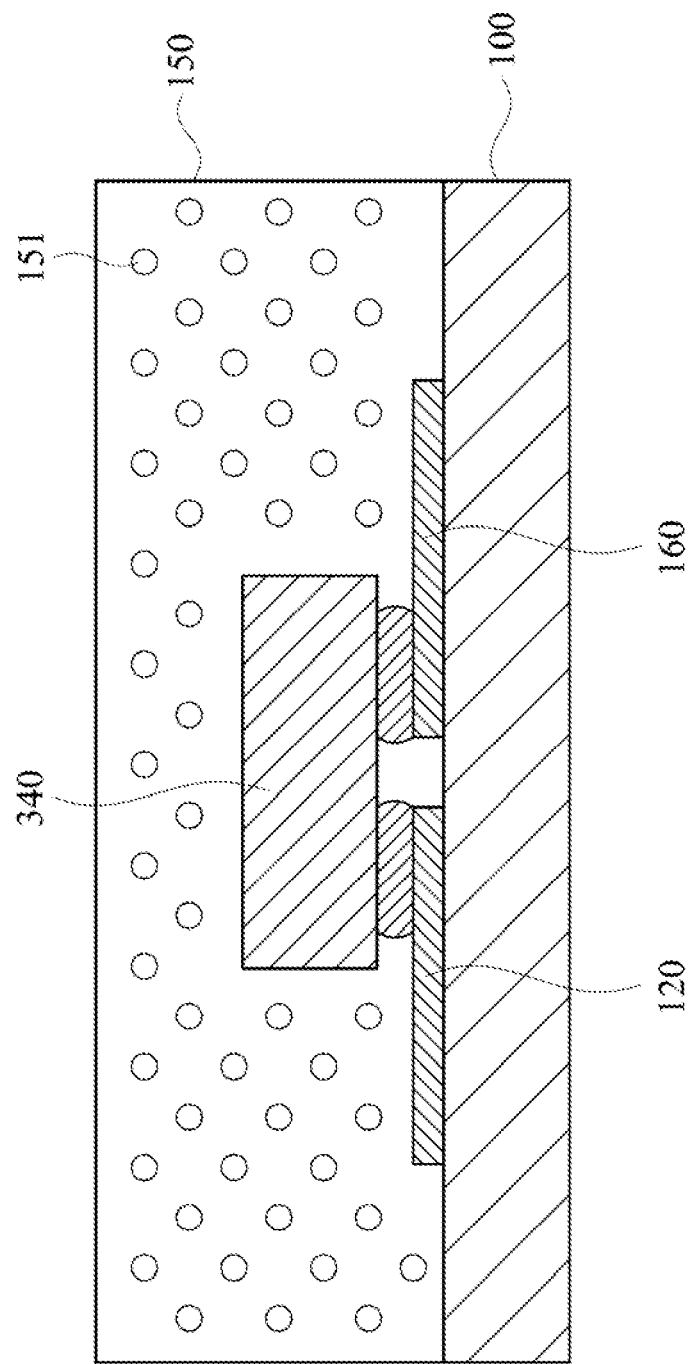
FIG. 3B illustrates a cross-sectional view taken along E_E' of FIG. 3A.
Figure 3C:
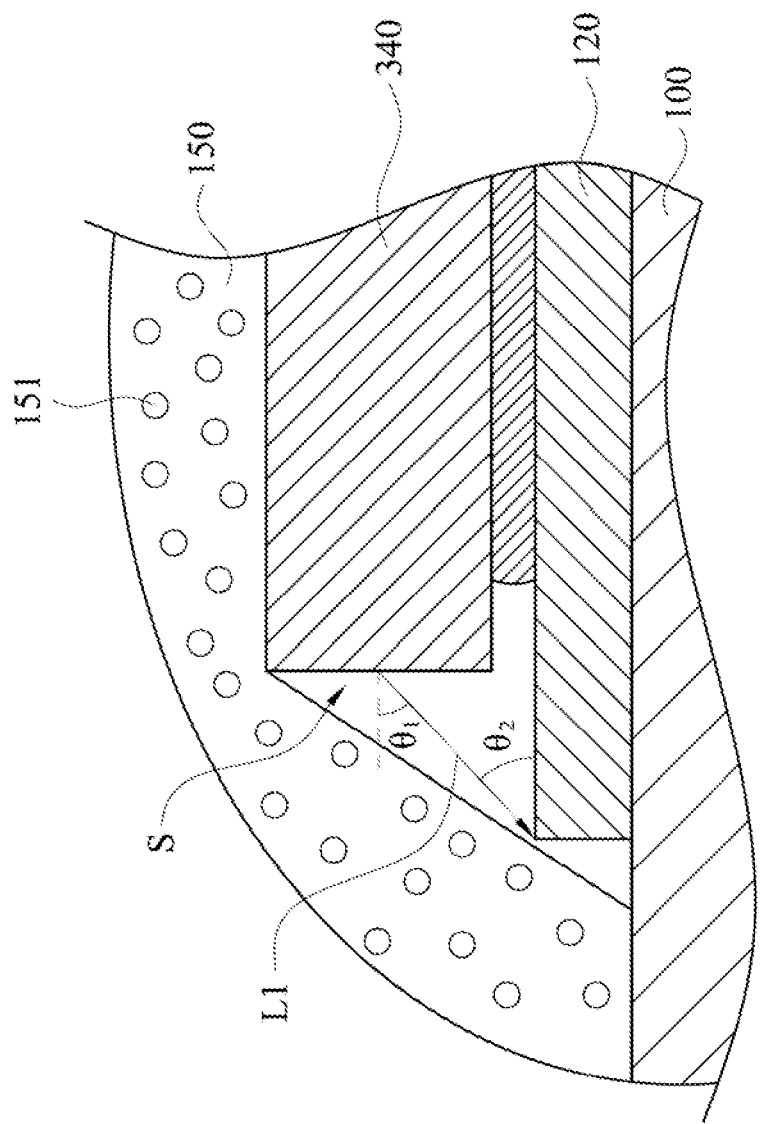
FIG. 3C illustrates a partial enlarged view of one LED chip in FIG. 3B.

Next, please refer to FIG. 3A, FIG. 3B and FIG. 3C, in which FIG. 3A illustrates a LED device in accordance with the third embodiment of the invention, FIG. 3B illustrates a cross-sectional view taken along E-E' of FIG. 3A, and FIG. 3C illustrates a partial enlarged view of one LED chip in FIG. 3B. The following descriptions mainly introduce the structural difference between the third embodiment and the first embodiment, and the same numeral numbers denotes the same or similar structure in the first embodiment.

As illustrated, the difference between the third embodiment and the first embodiment is that the LDE chips 340 of the LED device 30 in third embodiment is assembled on the transparent substrate 100 by means of flip-chip bonding. In present embodiment, there is no need for the conductive wires 139 to connect the LED chips. More specifically, the i$^{th}$ first reflection layer 120 and the i$^{th}$ second reflection layer 160 need to be aligned with each other such that the i$^{th}$ LED chip 340 can bridge the i$^{th}$ first reflection layer 120 and the i$^{th}$ second reflection layer 160 by means of flip-chip bonding, in which i is natural number and 1≤i≤N. Further, a first electrical contact layer 331 is disposed between each of the first reflection layers 120, and a second electrical contact layer 332 is disposed between each of the second reflection layer 160, so as to electrically connect each of the first reflection layer 120 and to electrically connect each of the second reflection layer 160. The first one of the N first reflection layers 120 can be electrically connected with the positive electrode 120 through the first electrical contact layer 331, and the first one of the N second reflection layers 160 can be electrically connected with the negative electrode 132 through the second electrical contact layer 332. Therefore, each of the LED chips 340 can be series connected through the first and the second reflection layers 120, 160 and each of the LED chips can be driven by the voltage potential between the positive electrode 131 and the negative electrode 132 to emit the light.

It is worth mentioned that, in FIG. 3C, because the LED chips 340 are disposed on the first reflection layers 120 and the second reflection layers 160 by means of flip-chip bonding, an angle θ1 defined by the light beam L1 emitted from a central position of a side face of the LED chip 340 and the horizontal direction may slightly larger than 38 degrees. That is, an angle $θ_2$ between the light beam L1 and an edge of the first reflection layer 120 is also slightly larger than 38 degrees, but is not limited thereto. In other embodiments, the angle $θ_1$ and the angle $θ_2$ are about 17~50 degrees.

As discussed above, the LED device of the first to third embodiments can make all the light beams emitted from the LED chips reach to the wavelength-converting layer by the configuration of the first reflection layer and the second reflection layer, in which some light beams may be reflected by the first or the second reflection layers to the wavelength-converting layer, and the other light beams may directly emit to the wavelength-converting layer, so as to prevent the issue of blue-ray leakage from the second surface or other surfaces of the transparent substrate.

Figure 4:
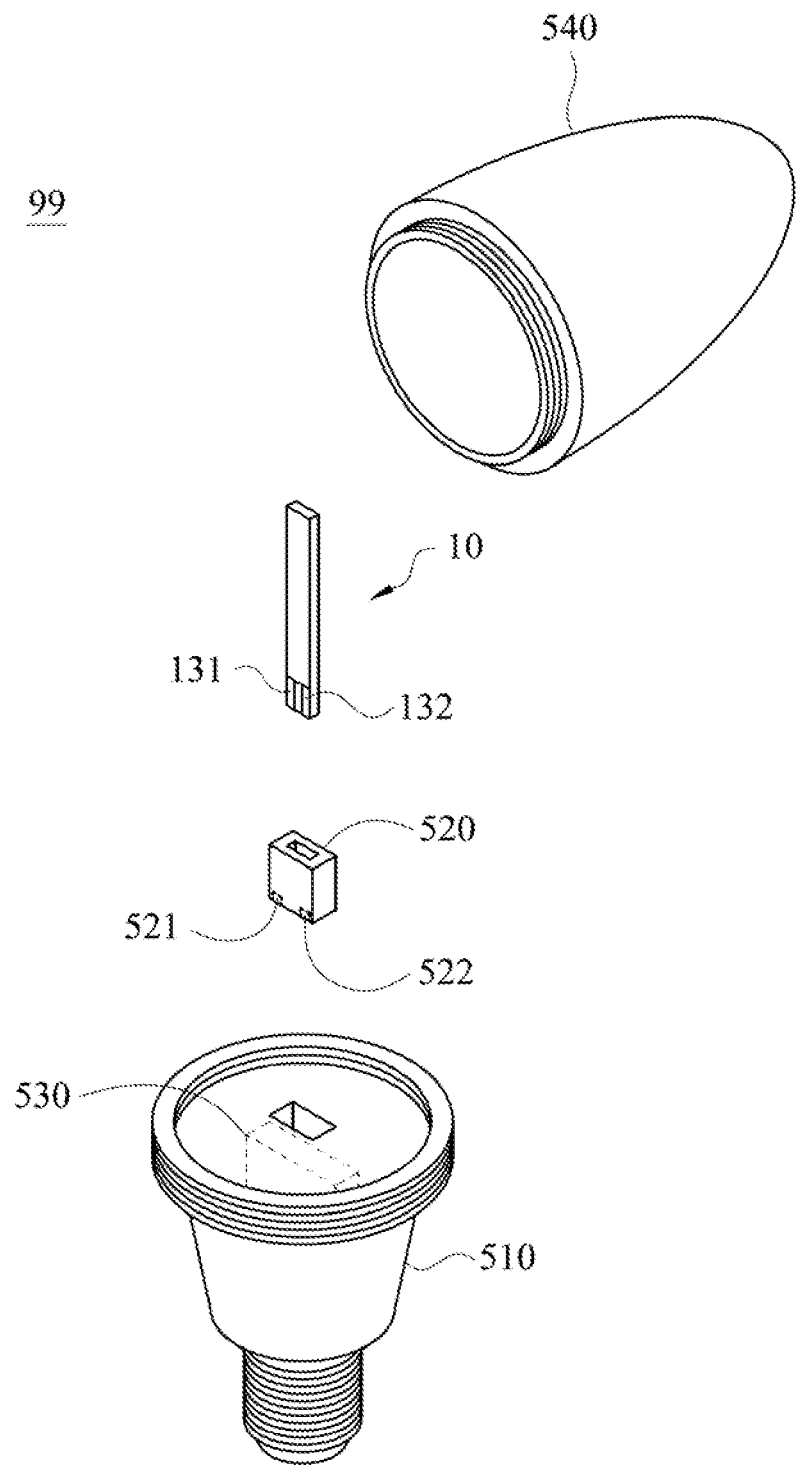
FIG. 4 illustrates an exploding view of a LED lamp in accordance with an embodiment of the invention.
Figure 5:
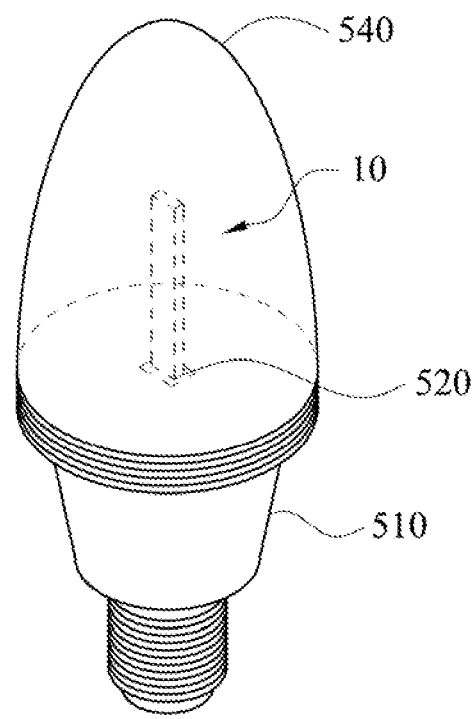
FIG. 5 illustrates a perspective view of FIG. 4.
Figure 6:
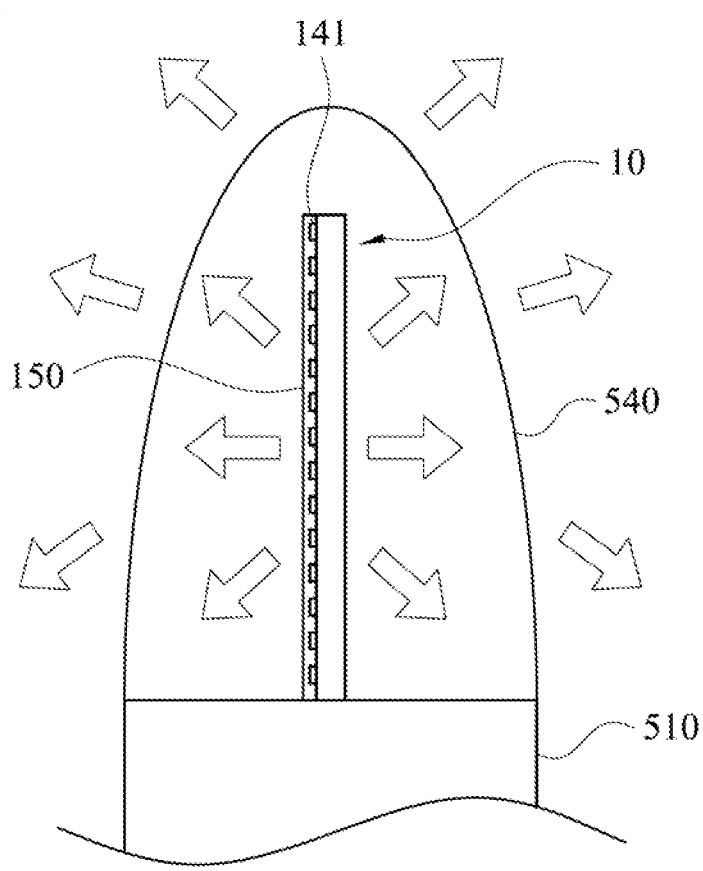
FIG. 6 Illustrates a side view of FIG. 5.

Next, please refer to FIG. 4 to FIG. 6, in which FIG. 4 illustrates an exploding view of a LED lamp in accordance with an embodiment of the invention, FIG. 5 illustrates a perspective view of FIG. 4, and FIG. 6 illustrates a side view of FIG. 5. As illustrated, a LED lamp 99 including a lamp base 510 and a LED device 10, 20, or 30 is shown in FIGS. 4 through 6. For convenience narrative, the LED device 10 of first embodiment is used as an example in the following descriptions.

As illustrated, the LED device 10 of the present embodiment has a positive electrode 131 and a negative electrode 132 on an end of the transparent substrate 100, in which the end of the transparent substrate is inserted into a slot 520 of the lamp base 510. The positive electrode 131 and the negative electrode 132 can be electrically connected with a positive contact point 521 and a negative contact point 522 in the slot 520 respectively.

The lamp base 510 may further includes a power driving member 530. The power driving member 530 can be electrically connected with the positive electrode 131 and the negative electrode 132 through the slot 520, so as to transfer an AC current source into a suitable current source for the first and second LED chips 141, 142 emitting the light (as illustrated in FIG. 1A).

In the present embodiment, the LED lamp 99 may further include a lamp cover 540 jointing to the lamp base 510, and the lamp cover 540 covers the LED device 10, so as to protect the LED device 10 and make the LED lamp 99 uniformly emit the light.

With Reference made to FIG. 6, by the configuration of the first and the second reflection layers 120, 160, the wavelength-converting layer 150 only needs to be disposed on a single surface that has LED chips 141, and then the leakage of the blue-ray can be prevented and meanwhile the LED device 10 can emit the light on double-sided.

As discussed above, by configuring a reflection layer between the LED chips and the transparent substrate and making the light beams emitted from the LED chips directly enter the wavelength-converting layer or be reflected into the wavelength-converting layer by the reflection layer, the LED device and the LED lamp of the above embodiments can prevent an issue of blue-ray leakage from the second surface or other surfaces of the transparent substrate. Furthermore, the wavelength-converting layer only needs to be disposed on a single surface of the transparent substrate having LED chips and does not need to be disposed on doubled-sided of the transparent substrate, so the manufacturing cost of the LED device and LED lamp can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode (LED) device, comprising:
a transparent substrate comprising a first surface and a second surface opposite to the first surface, wherein the first surface has a first reflection zone, a second reflection zone and a transparent zone outside of the first reflection zone and the second reflection zone thereon;
a first and a second reflection layers disposed on the first and the second reflection zones respectively;
a first and a second LED chips electrically connected with each other and disposed on the first and the second reflection layers respectively, wherein an orthographic projection of the first LED chip onto the transparent substrate is located within the first reflection zone and an orthographic projection of the second LED chip onto the transparent substrate is located within the second reflection zone;
a positive electrode and a negative electrode disposed on an end of the transparent substrate and electrically connected to the first and the second LED chips respectively; and
a wavelength-converting layer at least covering the first and the second reflection layers and the first and the second LED chips,
wherein the first and the second reflection layers respectively reflect a portion of light beams emitted from the first and the second LED chips to the wavelength-converting layer.

2. The LED device of claim 1, wherein the first reflection layer and the second reflection layer are separated from each other.

3. The LED device of claim 1, wherein the material of the first reflection layer and the second reflection layer includes metal.

4. The LED device of claim 1, wherein the first and the second LED chips are respectively a first and a second high-voltage LED chips.

5. The LED device of claim 1, wherein a light beam emitted from a side face of the first LED chip and an edge of the relative first reflection layer intersects at an angle between 17-50 degrees and a light beam emitted from a side face of the second LED chip and an edge of the relative second reflection layer intersects at an angle between 17-50 degrees.

6. A LED device, comprising:
a transparent substrate comprising a first surface and a second surface opposite to the first surface, wherein the first surface comprises a first row formed by arranging N first reflection zones in sequence and a second row formed by arranging N second reflection zones in sequence and a transparent zone outside of the first row and the second row thereon;
N first reflection layers disposed on the N first reflection zones respectively and N second reflection layers disposed on the N second reflection zones respectively;

N first LED chips electrically connected with each other and disposed on the N first reflection layers respectively, wherein an orthographic projection of each of the N first LED chips onto the transparent substrate is within the relative first reflection zone;

N second LED chips electrically connected with each other and disposed on the N second reflection layers respectively, wherein an orthographic projection of each of the N second LED chips onto the transparent substrate is within the relative second reflection zone;

a positive electrode and a negative electrode disposed on an end of the transparent substrate, wherein the positive electrode is electrically connected to the first one of the N first LED chips arranged in the first row, the negative electrode is electrically connected to the first one of the N second LED chips arranged in the second row, and the $N^{th}$ first LED chip of the first row is electrically connected to the $N^{th}$ second LED chip of second row; and a wavelength-converting layer at least covering the N first reflection layers, the N second reflection layers, the N first LED chips and the N second LED chips, wherein the N first and the N second reflection layers respectively reflect a portion of light beams emitted from the N first and the N second LED chips to the wavelength-converting layer; and wherein N is a natural number and N>1.

7. The LED device of claim 6, wherein the N first reflection layers are separated from the N second reflection layers.

8. The LED device of claim 7, wherein the material of the N first reflection layers and the N second reflection layers includes metal.

9. The LED device of claim 6, wherein a light beam emitted from a side face of each of the N first LED chips and an edge of the relative first reflection layer intersects at an angle between 17-50 degrees, and a light beam emitted from a side face of each of the N second LED chips and an edge of the relative second reflection layer intersects at an angle between 17-50 degrees.

10. A LED device, comprising:

a transparent substrate comprising a first surface and a second surface opposite to the first surface, wherein the first surface comprises a first row formed by arranging N first reflection zones in sequence and a second row formed by arranging N second reflection zones in sequence and a transparent zone outside of the first row and the second row thereon;

N first reflection layers disposed on the N first reflection zones respectively and N second reflection layers disposed on the N second reflection zones respectively, wherein the $i^{th}$ first reflection layer and the $i^{th}$ second reflection layer are aligned with each other and electrically connected with each other;

N LED chips, wherein the $i^{th}$ LED chip bridges the $i^{th}$ first reflection layer and the second reflection layer by means of flip-chip bonding;

a positive electrode and a negative electrode disposed on an end of the transparent substrate, wherein the positive electrode is electrically connected to the first one of the N first LED chips arranged in the first row, the negative electrode is electrically connected to the first one of the N second LED chips arranged in the second row; and a wavelength-converting layer at least covering the N first reflection layers, the N second reflection layers and the N LED chips, wherein the N first and the N second reflection layers respectively reflect a portion of light beams emitted from the N LED chips to the wavelength-converting layer; and wherein N and i are a natural number and N>1, 1≤i≤N.

11. The LED device of claim 10, wherein the N first reflection layers are separated from the N second reflection layers.

12. The LED device of claim 11, wherein the material of the N first reflection layers and the N second reflection layers includes metal.

13. The LED device of claim 10, wherein a light beam emitted from the $i^{th}$ LED chip and an edge of the $i^{th}$ first or the $i^{th}$ second reflection layers intersects at an angle between 17-50 degrees.

14. A LED lamp, comprising:

a lamp base comprising a power driving member; and a LED device comprising:

a transparent substrate comprising a first surface and a second surface opposite to the first surface, wherein the first surface comprises a first reflection zone, a second reflection zone and a transparent zone located outside of the first reflection zone and the second reflection zone thereon;

a first and a second reflection layers disposed on the first and the second reflection zones respectively;

a first and a second LED chips electrically connected with each other and disposed on the first and the second reflection layers respectively, wherein an orthographic projection of the first LED chip onto the transparent substrate is within the first reflection zone and an orthographic projection of the second LED chip onto the transparent substrate is within the second reflection zone;

a positive electrode and a negative electrode disposed on an end of the transparent substrate and electrically connected to the first and the second LED chips respectively, wherein the end of the transparent substrate is inserted into the lamp base and electrically connected to the power driving member; and a wavelength-converting layer at least covering the first and the second reflection layers and the first and the second LED chips, wherein the first and the second reflection layers respectively reflect a portion of light beams emitted from the first and the second LED chips to the wavelength-converting layer.

15. The LED lamp of claim 14, wherein the lamp base has a slot comprising a positive contact point and a negative contact point, and the end of the transparent substrate comprising the positive electrode and the negative electrode is inserted into the slot such that the positive contact point and the negative contact point are electrically connected to the positive electrode and the negative electrode respectively.

16. The LED lamp of claim 15, further comprising a lamp cover jointing to the lamp base, wherein the LED device is covered between the lamp cover and the lamp base.

* * * * *